(12) United States Patent
Kuhn et al.

(10) Patent No.: US 8,854,857 B2
(45) Date of Patent: Oct. 7, 2014

(54) ELECTRONIC DEVICE AND METHOD FOR FRAM POWER SUPPLY MANAGEMENT

(75) Inventors: Ruediger Kuhn, Freising (DE); Adi Baumann, Haag a. d. Amper (DE); Ronald Nerlich, Freising (DE); Matthias Arnold, Freising (DE); Christian Sichert, Attenkirchen (DE); Ralph Ledwa, Halblech (DE)

(73) Assignee: Texas Instruments Incorporated, Dallas, TX (US)

( * ) Notice: Subject to any disclaimer, the term of this patent is extended or adjusted under 35 U.S.C. 154(b) by 256 days.

(21) Appl. No.: 13/050,529

(22) Filed: Mar. 17, 2011

(65) Prior Publication Data
US 2014/0050008 A1    Feb. 20, 2014

(30) Foreign Application Priority Data
Mar. 17, 2010 (DE) .......................... 10 2010 011 749

(51) Int. Cl.
*G11C 11/22* (2006.01)
(52) U.S. Cl.
CPC ............ *G11C 11/2297* (2013.01); *G11C 11/22* (2013.01)
USPC ...... 365/145; 365/117; 365/189.05; 365/226; 365/227; 365/228

(58) Field of Classification Search
USPC ................. 365/117, 145, 226, 227, 228, 229, 365/189.05
See application file for complete search history.

(56) References Cited

U.S. PATENT DOCUMENTS

| | | | |
|---|---|---|---|
| 2001/0022741 A1 | 9/2001 | Takeuchi et al. | |
| 2004/0001359 A1 | 1/2004 | Ott | |
| 2008/0080255 A1 | 4/2008 | Kagan et al. | |
| 2010/0146333 A1* | 6/2010 | Yong et al. | ...................... 714/14 |
| 2010/0202238 A1* | 8/2010 | Moshayedi et al. | .......... 365/228 |

* cited by examiner

*Primary Examiner* — Tha-O H Bui
(74) *Attorney, Agent, or Firm* — Robert D. Marshall, Jr.; Frederick J. Telecky, Jr.

(57) ABSTRACT

The invention is an electronic device including a ferroelectric random access memory (FRAM), a first supply voltage domain, a second supply voltage domain and a low drop output voltage regulator (LDO) receive a first supply voltage of the first supply voltage domain and providing a second supply voltage of the second supply voltage domain. The second supply voltage domain supplies the FRAM. The LDO switches between a first state providing and maintaining the second supply voltage of the second supply voltage domain and a second state providing a high impedance output to the second supply voltage domain. The electronic device switches the LDO from the first state to the second state in response to a failure of the first supply voltage domain.

9 Claims, 3 Drawing Sheets

ELECTRONIC DEVICE AND METHOD FOR FRAM POWER SUPPLY MANAGEMENT

CLAIM OF PRIORITY

This application claims priority under 35 U.S.C. 119 (a) to German Patent Application No. 10 2010 011 749.8 filed Mar. 17, 2010.

TECHNICAL FIELD OF THE INVENTION

The technical field of this invention is an electronic device and a method for FRAM power supply management and more specifically to an electronic device and a method for providing a safe operation of an FRAM with respect to the power supply.

BACKGROUND OF THE INVENTION

One of the disadvantages of the FRAM memory technology is that each read access to the memory contents destroys the stored information in the memory cells. Therefore, the data that is read from memory cells needs to be written back into memory cells after each read access in order to restore their original content. This write operation is referred to as write-back. It is to be ensured under all circumstances, as for examples shorts on the supply pins of the FRAM memory device, that a complete write-back operation can be performed. Otherwise, the integrity of the FRAM memory is affected. However, in order to perform a complete write-back operation, the power supply system has to maintain a required supply voltage level for the FRAM memory during the event of power failure until the write-back operation is finished.

SUMMARY OF THE INVENTION

It is an object of the invention to provide an electronic device and a method for FRAM power supply management which are resistant to errors and failures due to power supply variations.

According to an aspect of the invention, an electronic device is provided which comprises a ferroelectric random access memory (FRAM). There is a first supply voltage domain, a second supply voltage domain and a low drop out voltage regulator (LDO) which is coupled to receive a supply voltage of the first supply voltage domain and to provide a supply voltage of the second supply voltage domain. This means that the LDO is coupled between the first and the second supply voltage domain and provides the supply voltage of the second supply voltage domain as an output voltage. The second supply voltage domain is advantageously confined to supply the FRAM. The LDO may then be configured to be switched into a first state for providing and maintaining the supply voltage of the second supply voltage domain and into a second state for providing a high impedance output to the second supply voltage domain. The electronic device may further be configured to switch the LDO from the first state to the second state in response to a failure condition of the first supply voltage domain. According to this aspect of the invention, the supply voltage for the FRAM memory is provided from an integrated voltage regulator (LDO) the output voltage of which is not available on any external device pin. The LDO is configured to drive the FRAM memory by providing the required supply voltage. If a failure on the LDO input (first supply voltage domain) is detected, the LDO output can be switched into a high impedance state. Furthermore, the failure condition can be flagged, stored and indicated or communicated to other stages of the electronic device.

A capacitor may be coupled between the output of the LDO and the power supply of the FRAM. The capacitor may be configured to provide sufficient charge for a complete FRAM access cycle after the LDO is switched into the second state. A complete FRAM access cycle includes a read cycle and a write-back cycle for the data. The capacitor may then advantageously be configured to provide just sufficient charge for a complete access cycle (read and write-back cycle) to the FRAM after the LDO is switched into the second state. This aspect of the invention provides that at least a complete access cycle (read and write-back cycle) can be performed even if the external power supply, the power supply of the first supply voltage domain or any other power supply drops out of the valid voltage range.

The capacitor may then be configured as a function of the supply voltage required for an access cycle of the FRAM. This may be defined as:

$$CAP = f(POWFRAM),$$

where: CAP is the capacitance of the buffer capacitor coupled between the output of the LDO and the power supply of the FRAM; and POWFRAM is the power required for a complete access cycle of the specific FRAM used in the application.

In an aspect of the invention, the access cycle (read and write-back cycle) can be performed self-timed. The access cycle in the second state can then be performed independently of any external clock or other control signals.

In another aspect of the invention, the electronic device may comprise a third supply voltage domain. This third supply voltage domain may then be configured to be available when either the supply voltage of the first supply voltage domain or the supply voltage of the second supply voltage domain is within a valid voltage range. Accordingly, important stages or important functions of the electronic device may be supplied by a supply voltage of the third voltage domain which can operate if either the first or the second supply voltage domain still has enough power. A buffer capacitance may be coupled so as to maintain the second supply voltage for a limited time. The second supply voltage in the second supply voltage domain may then be greater than the first supply voltage in the first supply voltage domain even if the second supply voltage is derived from the first supply voltage. The electronic device may further comprise a control stage which can be supplied by a supply voltage of the third voltage domain and be configured to hold the LDO in the second state. This provides that even in case of a failure of the first supply voltage in the first supply voltage domain, the LDO is held in the second state in order to make sure that the output of the LDO is in a high impedance condition so as to decouple the second supply voltage domain from the first supply voltage domain in the second state.

There may be a failure detector for detecting a failure of the voltage level in the first supply voltage domain that may be supplied by a supply voltage of the first supply voltage domain, the second supply voltage domain or the third supply voltage domain. The failure detector may be level sensitive and/or transient sensitive.

There may be an interface logic configured to generate isolation control signals for the FRAM memory. The interface logic may further be configured to stop any controller, logic or CPU (central processing unit) activities in response to a change from the first state to the second state. Accordingly, all inputs and outputs of the FRAM can be configured to be isolated and decoupled from other stages of the electronic device when the LDO is switched into the second state so as to prevent any further access to the FRAM.

Furthermore, the second supply voltage domain may be decoupled from any external pins of the electronic device. This aspect of the invention provides that the risk to cause any failure or variations of the supply voltage of the second supply voltage domain for the FRAM is minimized.

The invention also provides a method of supplying power to a ferroelectric random access memory (FRAM). According to this method, a low drop output voltage regulator (LDO) may receive a supply voltage of a first supply voltage domain. The LDO may then provide a supply voltage of a second supply voltage domain at an output. The second supply voltage domain can be confined to supply only the FRAM. The LDO may then be switched from a first state of providing and maintaining the supply voltage of the second supply voltage domain into a second state in which the output of the LDO is in a high impedance state in response to a failure condition of the first supply voltage domain.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
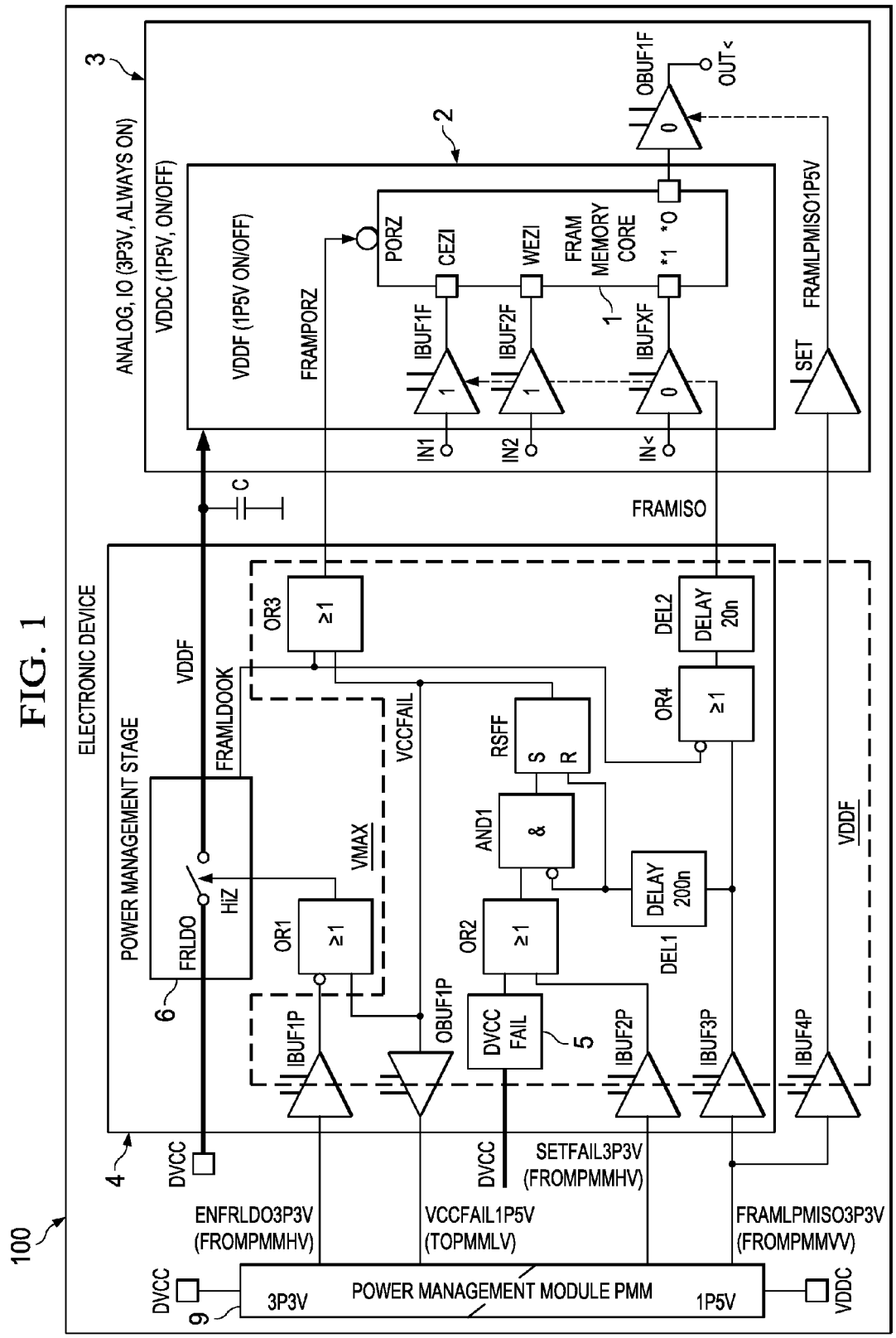
FIG. 1 is a simplified circuit diagram of an embodiment of the invention.

FIG. 1 shows a simplified circuit diagram of an electronic device 100 according to an embodiment of the invention. There is an FRAM memory core 1 comprising ferroelectric random access memory cells. The FRAM memory core 1 is configured through a reset signal FRAMPORZ, a write enable signal WEZI and a core enable signal CEZI. There are further input signals INX for writing to the FRAM memory core and output signals OUTX to read data from the FRAM memory core 1. There are various buffers IBUF1F, IBUF2F, IBUFXF for input signals IN1, IN2 and INX as well as output buffers OBUF1F for output signals OUTX. Each buffer can represent numerous buffers of a respective input bus (IN1 to INX) or an output bus (OUTX). The input buffers IBUF1F, IBUF2F and IBUFXF are configured through an FRAM isolation signal FRAMISO and the output buffers OBUF1F are configured through an output isolation signal FRAMLPMISO1P5V. The memory core and the input buffers can be supplied by a supply voltage VDDF of a second voltage domain. The output buffers OBUF1F are supplied by a supply voltage VDDC of another supply voltage domain. The supply voltage domains VDDC and VDDF are both supply voltage domains which may have a supply voltage level of about 1.5 V. Outside of the supply domains VDDF and VDDC there might be another supply voltage domain that can be an analog input/output supply voltage domain of 3.3 V. This supply voltage domain may always be switched on.

There is further a power management stage 4 including various input and output buffers IBUF1P, OBUF1P, IBUF2P, IBUF3P, logic gates OR1, OR2, OR3, OR4, AND1, RSFF and delay stages DEL1, DEL2. There is further a supply voltage failure detector DVCCFAIL 5. There is also a low drop output voltage regulator FRLDO 6 which can be switched from a first state to a second state. In the first state, the LDO 6 provides and maintains as an output the supply voltage level VDDF for the second supply voltage domain for the FRAM memory core 1 and the input buffers. The output voltage of the LDO 6 is buffered by a capacitor C. The LDO receives a supply voltage of a first domain DVCC and derives the supply voltage of the second supply voltage domain VDDF from the first supply voltage domain DVCC. The capacitor C is configured to store sufficient charge in order to supply the FRAM memory core 1 and the input buffers IBUF1F, IBUF2F and IBUFXF, i.e. the voltage domain VDDF in order to perform at least one access cycle for the FRAM.

The buffers IBUF1P, IBUF2P, IBUF3P, IBUF4P and OBUF1P may be configured as level shifters in order to pass signals from the second voltage domain VDDF to the first voltage domain DVCC. The buffers may then be supplied by both voltage domains. The signals ENFRLDO3P3V, VCCFAIL1P5LV, SETFAIL3P3V and FRAMLPMISO3P3 are received or sent to a power management module PMM 9. This power management module may be configured to provide additional supply voltage monitoring and managing features. The power management module PMM 9 may then be coupled to the first supply voltage domain DVCC (for example a 3.3 V voltage domain and to the supply voltage VDDC which may be a 1.5 V supply voltage domain. The logic gates OR2, AND1, RSFF, OR3, OR4, DEL2 as well as the voltage failure detector DVCCFAIL 5 are supplied with the supply voltage VDDF of the second supply voltage domain. Only the logic gate OR1 may be supplied with the maximum supply VMAX, which is the maximum of the first supply voltage DVCC and the second supply voltage VDDF. The capacitor C may also be integrated into the electronic device 100. Supplying the logic gate OR1 with the maximum of the first and the second supply voltages (VMAX=max [DVCC, VDDF]) it can be prevented that the isolation of the FRAM due to a supply voltage failure is affected if either of the two supply voltage levels (DVCC or VDDF) suddenly drops.

Figure 2:
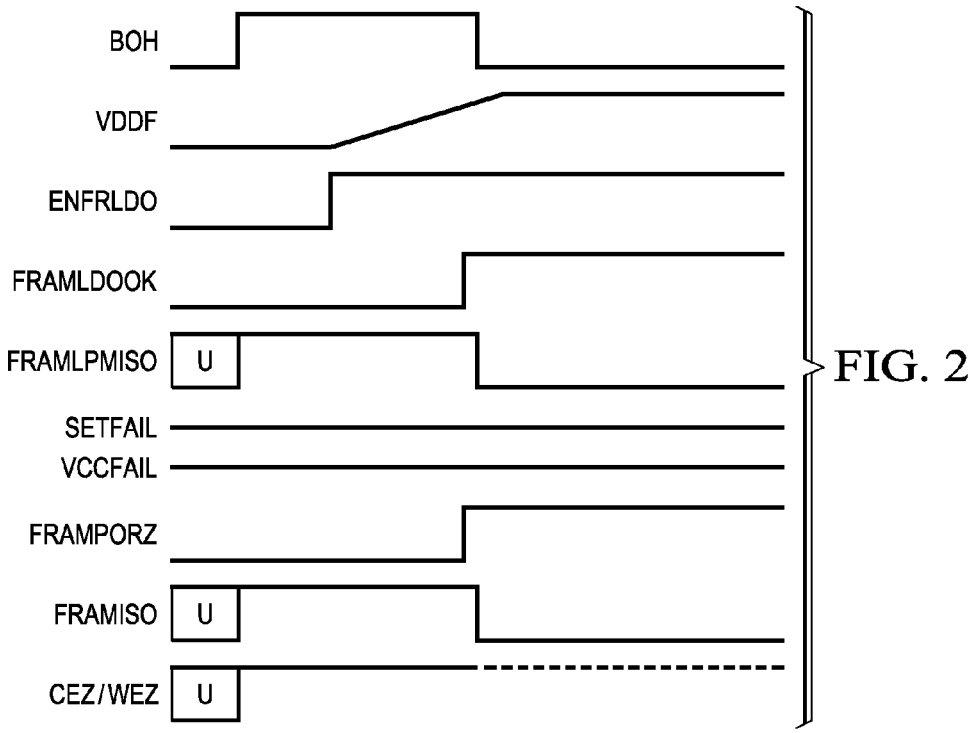
FIG. 2 shows waveforms of signals of the embodiment shown in FIG. 1 during a power up sequence.

FIG. 2 shows waveforms of signals relating to a power up sequence of the embodiment shown in FIG. 1. The normal power up sequence starts with signal BOH changing from low to high. The LDO is then turned on by changing ENFRLDO from low to high and the voltage supply VDDF of the second domain rises. If the supply voltage level VDDF of the second supply voltage domain has reached the target value, signal FRAMLDOOK changes from low to high to indicate that signal FRAMLMPISO can be changed from high to low. This means that the output buffers (OBUF1F shown in FIG. 1) can be switched on. The FRAM memory core is then changed from an isolated state to a state where it can communicate with other stages, or processing units. Signals like SETFAIL or VCCFAIL remain unasserted as no error occurred. The FRAM can be changed from a reset state into a state where it is not reset. Finally, after a predefined period of time which is due to the delays shown in FIG. 1, signal FRAMISO changes from high to low in order to activate the input buffers IBUF1F, IBUF2F to IBUFXF (i.e. changing from high impedance or tristate to normal operation).

Figure 3:
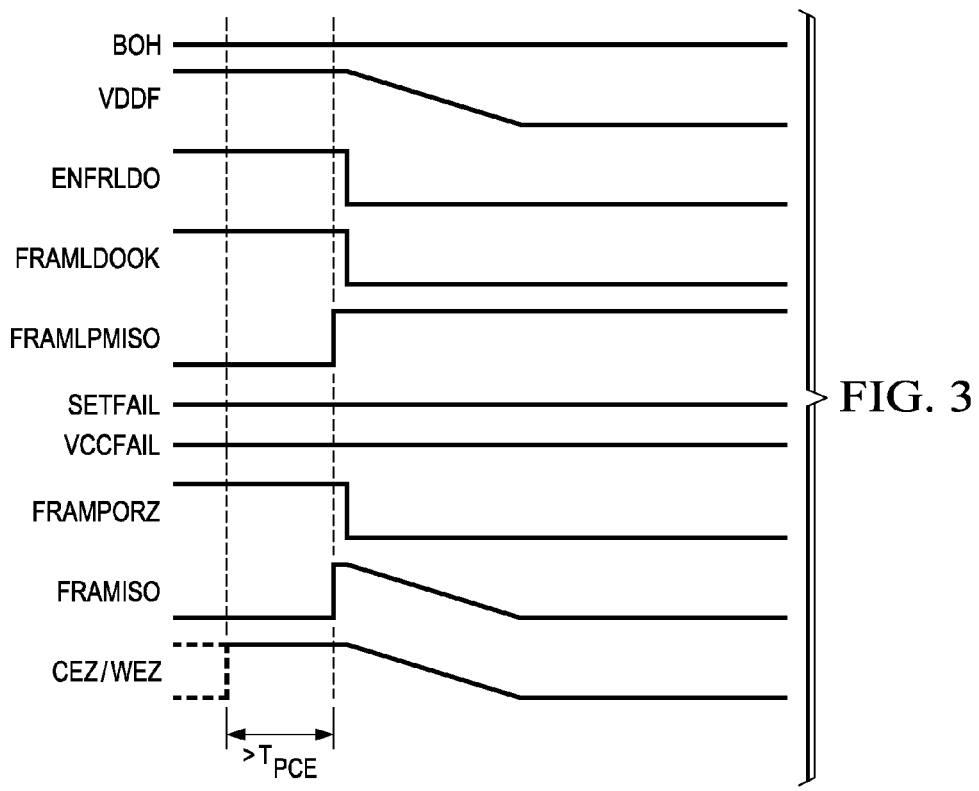
FIG. 3 shows waveforms of signals of the embodiment of FIG. 1 relating to low power modes.

FIG. 3 shows most of the signals already shown and explained with respect to FIG. 1 and FIG. 2 for a sequence where the system is switched into a low power mode. The FRAM power supply VDDF is turned off. The enable signal ENFRLDO is switched from high to low. The LDO is switched into high impedance state and the second power supply domain for the FRAM is isolated. The FRAM isolation signal FRAMLPMISO is switched on in order to isolate the output buffers OBUF1F. The FRAM is reset by changing FRAMPORZ from high to low. However, the minimum pulse width for signal CEZ and WEZ (select and write signal for the write back cycle) is preserved and the signals CEZ and WEZ are maintained in order to assure that one single access cycle (read and write back cycle) can be performed. Additional digital logic ensures that FRAMLPM is only asserted as long as no FRAM access occurs. All power supply levels supplied by VDDF decrease.

Figure 4:
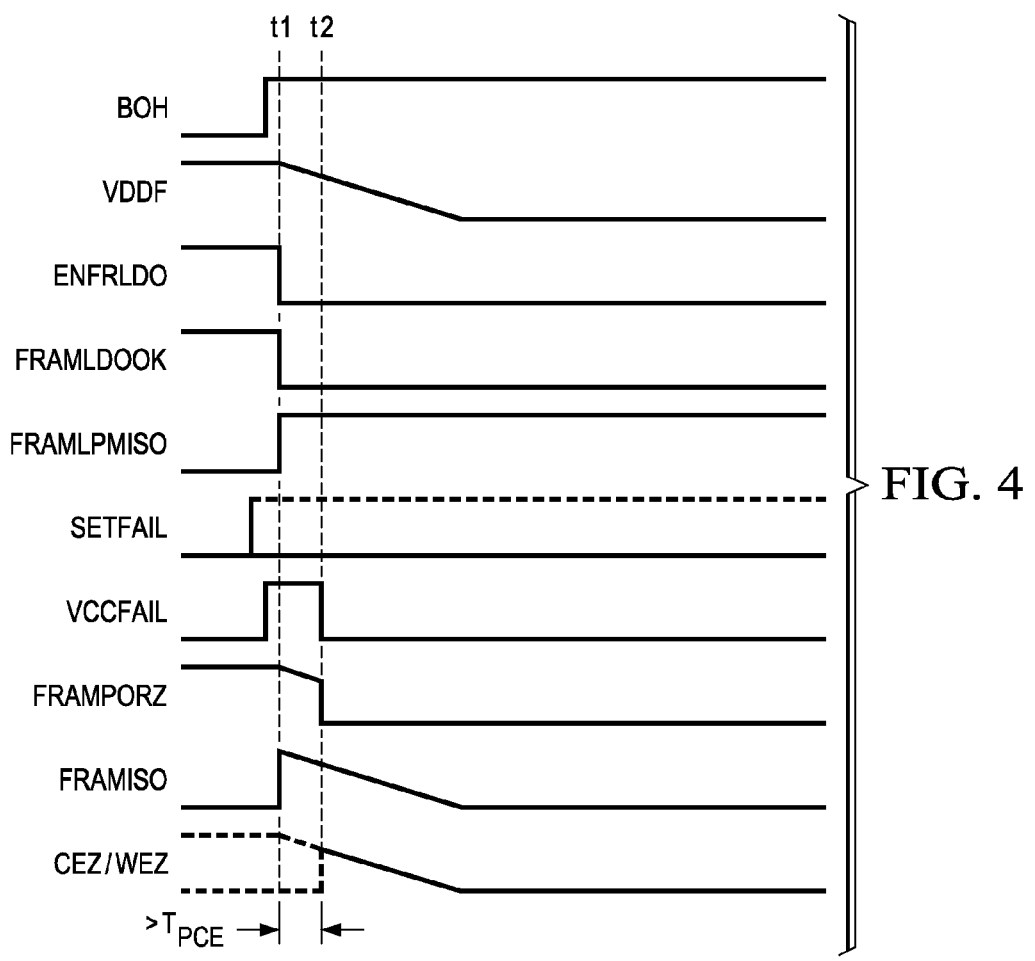
FIG. 4 shows waveforms of signals of FIG. 1 relating to a power failure or reset sequence.

FIG. 4 shows waveforms of the signals shown in FIG. 1 relating to a power failure and reset sequence. A reset may be issued by the power management module PMM 9 or by a software signal, which is indicated by signal SETFAIL switching to high. There may also be a DVCC detector (shown in FIG. 1) that issues a signal VCCFAIL indicating that the voltage level of the first voltage domain dropped below a valid level. Regardless of the failure type (RESET, software, DVVC fail detected etc.), the handling can always be the same. Both alternatives are indicated by a signal VCCFAIL which can be a flag indicating a failure of a supply voltage. The FRAM is isolated before other stages are switched off. The chip level reset signal may therefore be delayed. All interfaces of the FRAM are isolated by asserting signals FRAMISO and FRAMLPMISO. The VCCFAIL flag is cleared after a delay time which is greater than TPCE, i.e. the minimum time for the access cycle (read and write back cycle). Any potential FRAM cycle may then be completed. At time t2, the VDDF is still above 1.35 V (in this embodiment). The FRAM reset signal FRAMPORZ is then (time t2) changed from high to low. CEZ and WEZ are again asserted during time TPCE to ensure that a complete cycle of operation for the FRAM can be finished.

Although the invention has been described hereinabove with reference to a specific embodiment, it is not limited to this embodiment and no doubt further alternatives will occur to the skilled person that lie within the scope of the invention as claimed.

What is claimed is:

1. An electronic device comprising:
   a first supply voltage domain having a first supply voltage;
   a second supply voltage domain having a second supply voltage;
   a low drop output voltage regulator (LDO) receiving and powered by said first supply voltage and providing said second supply voltage of said second supply voltage domain, said low drop output voltage regulator having a first state providing and maintaining said second supply voltage of said second supply voltage domain and having a second state providing a high impedance output to said second supply voltage domain, said low drop output voltage regulator switching from said first state to said second state in response to a failure of said first supply voltage domain;
   a ferroelectric random access memory (FRAM), said FRAM memory part of said second supply voltage domain and powered by said second supply voltage;
   a plurality of input buffers having inputs receiving signals intended for said FRAM memory and outputs connected to supply said signals to said FRAM memory, said plurality of input buffers part of said second voltage domain and powered by said second supply voltage; and
   a plurality of output buffers having inputs receiving signals from said FRAM memory and outputs connected to supply said signals to circuits outside said FRAM memory, said plurality of output buffers part of said second voltage domain and powered by said second supply voltage.

2. The electronic device according to claim 1, further comprising:
   a capacitor coupled between the output of said low drop output voltage regulator and said FRAM, said capacitor having a capacitance to provide sufficient charge for a complete FRAM access cycle following said low drop output voltage regulator switching into said second state.

3. The electronic device according to claim 2, wherein:
   said capacitor has a capacitance to provide sufficient charge for a complete access cycle including a read and write-back cycle to the FRAM following said low drop output voltage regulator switching into the second state.

4. The electronic device according to claim 1, further comprising:
   a third supply voltage domain having a third supply voltage configured to be available when either said first supply voltage of said first supply voltage domain or said second supply voltage of said second supply voltage domain is within a valid voltage range.

5. The electronic device according to claim 4, further comprising:
   a control stage supplied by said third supply voltage of the third voltage domain, said control state configured to hold said low drop output voltage regulator in said second state.

6. The electronic device according to claim 1, further comprising:
   a failure detector for detecting a failure of a voltage level in said first supply voltage, said failure detector supplied by said first supply voltage of said first supply voltage domain or said second supply voltage of said second supply voltage domain.

7. The electronic device according to claim 1, wherein:
   all inputs and outputs of said FRAM are decoupled from said first supply voltage domain.

8. The electronic device according to claim 1, wherein:
   all inputs and outputs of said FRAM are isolated and decoupled from other stages of the electronic device when said low drop output voltage regulator is switched into said second state thereby preventing any further access to said FRAM.

9. The electronic device according to claim 1, wherein:
   said second supply voltage domain is decoupled from any external pins of the electronic device.

\* \* \* \* \*